United States Patent
Yoon et al.

(10) Patent No.: US 11,368,008 B2
(45) Date of Patent: Jun. 21, 2022

(54) ARC PROTECTION SYSTEM AND METHOD TO CONTROL ARC PROTECTION SYSTEM

(71) Applicant: NEXPO CO., LTD., Seongnam-si (KR)

(72) Inventors: Soon Il Yoon, Seoul (KR); Hyun Moo Jo, Seongnam-si (KR); Sang Min Lee, Seoul (KR)

(73) Assignee: NEXPO CO., LTD., Seongnam-si (KR)

( * ) Notice: Subject to any disclaimer, the term of this patent is extended or adjusted under 35 U.S.C. 154(b) by 0 days.

(21) Appl. No.: 16/905,088

(22) Filed: Jun. 18, 2020

(65) Prior Publication Data
US 2020/0403394 A1 Dec. 24, 2020

(30) Foreign Application Priority Data

Jun. 20, 2019 (KR) .................. 10-2019-0073672
May 7, 2020 (KR) .................. 10-2020-0054560

(51) Int. Cl.
*H02H 1/00* (2006.01)
*G01R 31/52* (2020.01)

(52) U.S. Cl.
CPC .......... *H02H 1/0015* (2013.01); *G01R 31/52* (2020.01)

(58) Field of Classification Search
CPC ........ H02H 1/0015; H02H 3/023; H02H 7/26; G01R 31/52; G01R 19/16571
See application file for complete search history.

(56) References Cited

U.S. PATENT DOCUMENTS

| | | | | |
|---|---|---|---|---|
| 2014/0192458 | A1* | 7/2014 | Valdes | H01H 83/00 |
| | | | | 361/626 |
| 2017/0018913 | A1* | 1/2017 | Zheng | H02B 13/065 |
| 2017/0179711 | A1* | 6/2017 | Numata | H02B 13/025 |
| 2018/0241193 | A1* | 8/2018 | Louco | H02H 3/08 |

FOREIGN PATENT DOCUMENTS

| | | |
|---|---|---|
| CN | 106356754 | 1/2017 |
| KR | 20110045854 | 5/2011 |
| KR | 101631638 | 6/2016 |
| KR | 20170106273 | 9/2017 |

(Continued)

OTHER PUBLICATIONS

Englist translation of Lee KR101879742 (Year: 2018).*

(Continued)

*Primary Examiner* — Thienvu V Tran
*Assistant Examiner* — Bart Iliya
(74) *Attorney, Agent, or Firm* — Cantor Colburn LLP

(57) ABSTRACT

Provided is an arc protection system in which an arc remover does not operate in a case of a phase-to-phase short circuit fault or a ground/earth fault among arc faults in a distribution panel, the arc protection system including a sensor configured to sense an arc fault of a distribution panel, an arc removing unit configured to ground a fault current, and a control unit connected to the sensor and configured to measure a short circuit current value of the distribution panel, wherein when the arc fault is sensed and the short circuit current value corresponds to a three-phase short circuit current, the control unit drives the arc removing unit, and when the short circuit current value is smaller than the three-phase short circuit current, the control unit does not drive the arc removing unit.

10 Claims, 7 Drawing Sheets

(56) References Cited

FOREIGN PATENT DOCUMENTS

| KR | 101869725 | 6/2018 |
|---|---|---|
| KR | 101879742 | 7/2018 |

OTHER PUBLICATIONS

Korean Notice of Allowance—Korean Application No. 10-2019-0073672 dated Mar. 24, 2020, citing KR 10-1879742, KR 10-2011-0045854, and KR 10-2017-0106273.
Korean Office Action—Korean Application No. 10-2019-0073672 dated Jul. 15, 2019, citing KR 2017-0106273, KR 10-1879742, and KR 2011-0045854.
Yang, The application of REA10_series arc protection system on the medium-voltage busbar of small hydropower in a substation of 110kV, 2011 Yunnan Electric Power Technology Forum.

* cited by examiner

ARC PROTECTION SYSTEM AND METHOD TO CONTROL ARC PROTECTION SYSTEM

FIELD OF THE INVENTION

The present invention disclosed herein relates to an arc protection system and a control method thereof, and more particularly, to an arc protection system including an arc remover that removes an arc by short-circuiting and grounding a main circuit breaker, which breaks the connection between an upper bus and a lower bus in a switchgear of a power apparatus, and a control method thereof.

BACKGROUND ART

A switchgear is an apparatus that is provided in a power system, receives power from the power system, and supplies power required by a load facility of each power receiver. Here, a distribution panel is for converting power of an extra high voltage into a high voltage or a low voltage, and distributing the converted voltage for each system in order to operate or control a power plant, a substation, or the like, or to operate a motor, and refers to electric facilities such as a transformer, a switch device, and other safety devices arranged uniformly inside a cabinet.

In such a distribution panel, an arc fault may occur according to short-circuiting due to electrical breakdown therein or aging degradation, and an explosion may occur due to high temperature and high pressure when the fault occurs.

In particular, when the arc fault occurs, scintillation and an arc current are generated, the central temperature of an electric arc is raised to about 2,000 K, and arc energy is converted to a type such as heat, pressure, radiant energy, or the like, to cause a serious damage to surrounding apparatuses and devices, and even result in casualties.

Furthermore, when an electric arc is generated due to a short circuit not in an arc extinguishing unit such as a circuit breaker but in an insulation part, damages occur to a human and a power apparatus, and long time blackout and maintenance issues also occur. Accordingly, it is very important to be suitably equipped with an arc protection system including a protective relay.

Typically an arc protection system is provided in a distribution panel, and causes scintillation to be perceived by means of a sensor for sensing an arc fault in the distribution panel, a short circuit current to be instantly sensed, and a protective relay to transmit an operation signal to an arc remover so as to short-circuit and ground a fault current. Accordingly the arc at the fault-occurred point becomes extinguished.

However, the arc remover grounds the distribution panel in a three-phase short circuit state, and thus a high current flows through the overall distribution panel system. Accordingly, there is an issue in that a facility, such as a transformer with low insulation strength, is burnt out due to short circuit strength that does not meet a criterion.

In particular, for a case other than a three-phase short circuit fault, namely, for a phase-to-phase short circuit fault or a ground/earth fault, a fault current is not large, explosion energy is small even when an arc is accompanied, and thus the degree of electrical breakdown is small. However, when an arc remover is applied to all kinds of arc faults without discerning the three-phase short circuit fault from other faults, a high current flows and a facility becomes burnt out even in a relatively small fault. When the facility is burnt out, the arc fault occurs. 75% of total faults occur when an operator is present around the distribution panel, and thus the casualty issue is also serious.

Meanwhile, there is a case where a plurality of distribution panels are operated. FIG. 1 is a schematic diagram of a typical arc protection system for operating a plurality of distribution panels. With reference to FIG. 1, upper buses of incoming-A IN-A and incoming-B IN-B are connected in parallel with a bus-tie TIE-C interposed therebetween, cables as lower buses are connected with each of the incoming-A IN-A and the incoming-B IN-B in parallel through a busbar BUS. A circuit breaker CB is installed in each of the incoming-A IN-A, incoming-B IN-B, bus-tie TIE-C, and the cables.

As shown in the drawing, the lower busses are connected to the incoming-A IN-A and the incoming-B IN-B so as to distribute electricity to a load side, but like the drawing, the distribution panels are actually connected in parallel, and if necessary, are formed so that a part of upper buses is used to distribute the electricity to nearby lower buses through the bus-tie TIE-C. Upper buses not used here are in a state in which the circuit breakers are open. FIG. 1 illustrates that electricity is distributed using the incoming-A IN-A to the lower buses of the incoming-B IN-B.

In this state, when an arc fault occurs in the distribution panel (B on the drawing) in the incoming-B side, an arc in the incoming-B IN-B may be sensed by a sensor, but the circuit breaker of the incoming-B IN-B is open and thus a fault current is not possibly measured. In addition, in the distribution panel in the incoming-A side, a fault current is sensed, but the light generated in the arc fault may not be sensed. Accordingly, in this case, the arc fault in the incoming-B side distribution panel may not be protected.

In addition, it is typical that the incoming-A IN-A and the incoming-B IN-B are disposed in physically divided spaces, and the bus-tie TIE-C is installed to belong to any one side of them. For example, as shown in drawing, the bus-tie TIE-C may be installed in the incoming-A side. In this case, when an arc fault occurs in an incoming-B side section (C on the drawing) of the bus-tie TIE-C, the arc and the fault current are sensed in the incoming-A side, but an arc remover in the incoming-B side is required to operate in order to remove the arc. However, since the arc is not sensed in the incoming-B side, the arc remover does not operate.

SUMMARY OF THE INVENTION

To solve the above-mentioned limitations, the present invention provides an arc protection system in which an arc remover does not operate in a case of a phase-to-phase short circuit fault or a ground/earth fault among arc faults in a distribution panel.

The present invention also provides an arc protection system and a control method for the arc protection system in which weak points in protection are improved, the weak points including that a fault current is not sensed in an upper bus side when an arc fault occurs, and that an arc protection system, which is required to be operated when an arc fault occurs, does not operate.

In accordance with an embodiment of the present invention, an arc protection system includes: a sensor configured to sense an arc fault of a distribution panel; an arc removing unit configured to ground a fault current; and a control unit connected to the sensor and configured to measure a short circuit current value of the distribution panel, wherein when the arc fault is sensed and the short circuit current value corresponds to a three-phase short circuit current, the control unit drives the arc removing unit, and when the short circuit current value is smaller than the three-phase short circuit current, the control unit does not drive the arc removing unit.

The arc protection system may further include a circuit breaking unit installed to open or close a circuit of the distribution panel, wherein when the short circuit current value is equal to or greater than a first setting value, the control unit determines that the three-phase short circuit current flows, and when short circuit current value is equal to or greater than a second setting value that is smaller than the first setting value, the control unit opens the circuit breaking unit.

The distribution panel may include a main circuit and a plurality of sub-circuits to which power is distributed from the main circuit, the circuit breaking unit may include a main circuit breaker configured to open or close a current of the main circuit, and a sub-circuit breaker configured to open or close a current of the sub circuit, and the sensor may include a first sensor installed in a side to which the power is supplied and a second sensor installed in a side to which the power may be distributed on the basis of the sub-circuit breaker interposed therebetween, wherein when the arc fault is sensed by the first sensor, the main circuit breaker is open, and when the arc fault is sensed by the second sensor, the sub-circuit breaker is open.

In accordance with an embodiment of the present invention, a control method of an arc protection system, includes: sensing an arc fault when the arc fault occurs in a distribution panel, and measuring a short circuit current value of the distribution panel; determining a range of the short circuit current value; and grounding a fault current, when the short circuit current value corresponds to a three-phase short circuit current.

The determining of the range may include: determining which range the short circuit current value corresponds to among a range equal to or greater than a first setting value, a range between the first setting value and a second setting value, and a range smaller than the second setting value on the basis of the first setting value and the second setting value smaller than the first setting value; determining a short circuit current as the three-phase phase short circuit current, when the short circuit current value is equal to or greater than the first setting value; and opening a circuit breaking unit, when the current value is equal to or greater than the second setting value, to remove a current caused by the arc fault.

A circuit breaker of a main circuit or a circuit breaker of a sub-circuit to which power is distributed from the main circuit may be selectively opened according to a position at which the arc fault is sensed.

In accordance with an embodiment of the present invention, an arc protection system of a distribution panel, that supplies power from an upper bus to a plurality of lower buses, includes: a first distribution panel, a second distribution panel, and a tie configured to electrically connect the first distribution panel and the second distribution panel, wherein each of the first distribution panel and the second distribution panel includes: a sensor configured to sense an arc fault of the distribution panel; an arc removing unit configured to ground a fault current; and a circuit breaking unit installed to open or close a circuit of the distribution panel, wherein the first distribution panel includes a first control unit connected to the sensor and configured to measure a short circuit current value of the first distribution panel, the second distribution panel includes a second control unit connected to the sensor and configured to measure a short circuit current value of the second distribution panel, the first control unit and the second control unit share a short circuit current state value in a state in which the circuit breaking unit of the second distribution panel is open, the short circuit current state value includes a short circuit current value or whether a short circuit current is generated, the second control unit uses the short circuit current state value of the first distribution panel when the sensor of the second distribution panel senses the arc fault, drives the arc removing unit when a three-phase short circuit current is determined to be generated in the second distribution panel, and does not drive the arc removing unit when the three-phase short circuit current is not determined to be generated.

When the sensor included in the second distribution panel senses the arc fault, the first control unit may transmit the short circuit current state value of the first distribution panel to the second control unit, and the short circuit current state value may include a short circuit current value or whether the short circuit current is generated.

The second control unit may determine whether the short circuit current is generated using the short circuit current value of the first distribution panel, which is transmitted from the first control unit, or calculate a short circuit current value of the second distribution panel, may drive the arc removing unit when the short circuit current value of the second distribution panel is calculated and the calculated short circuit current value of the second distribution panel exceed a setting value, the setting value may be a lowest value of a current value at a time of three-phase short circuit of the second distribution panel, and the second control unit may drive the arc control unit, when the calculated short circuit current value of the second distribution panel corresponds to the current at the time of the three-phase short circuit.

The first unit and the second unit may include a connection for a digital signal for transmitting and receiving bi-directionally the short circuit current value.

The tie may be formed to electrically connect or separate the first distribution panel and the second distribution panel, and be connected on the connection for the digital signal, and the first control unit may transmit a short circuit current value measurement state of the first distribution panel to the second control unit in a state in which the tie is connected.

In accordance with an embodiment of the present invention, a control method of an arc protection system includes: sensing an arc fault in a second distribution panel, and measuring a short circuit current state value of a first distribution panel electrically connected to the second distribution panel, when the arc fault occurs in a state in which a circuit breaking unit of the second distribution panel is open; transmitting the short circuit current state value of the first distribution panel to the second distribution panel; determining whether a short circuit current is generated in the second distribution panel or calculating a short circuit current value of the second distribution panel using the short circuit current state value of the first distribution panel; and determining a range of the calculated short circuit current value of the second distribution panel and grounding a fault current, when the short circuit current value of the second distribution panel corresponds to a three-phase short circuit current.

The first distribution panel and the second distribution panel may be electrically connected with or separated from each other by a tie, and a short circuit current value measurement state of the first distribution panel may be transmitted to the second distribution panel in a state in which the tie is connected.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Hereinafter, detailed embodiments of the present invention will be described with reference to the drawings.

Figure 1:
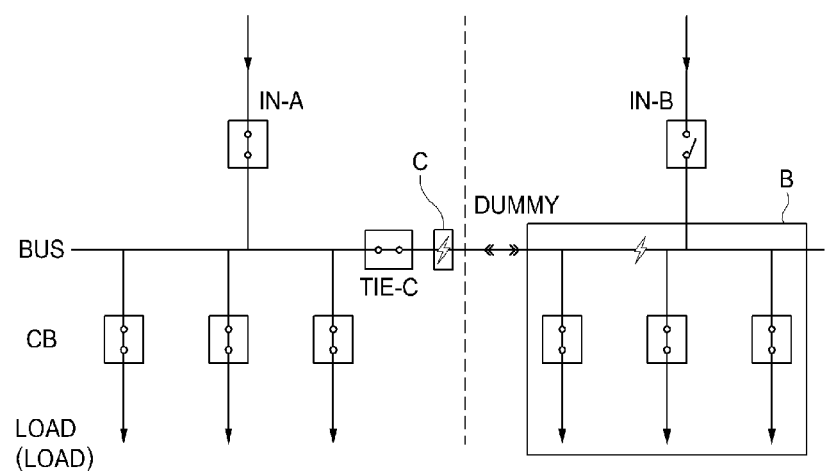
FIG. 1 is a schematic diagram of a typical arc protection system for operating a plurality of distribution panels.
Figure 2:
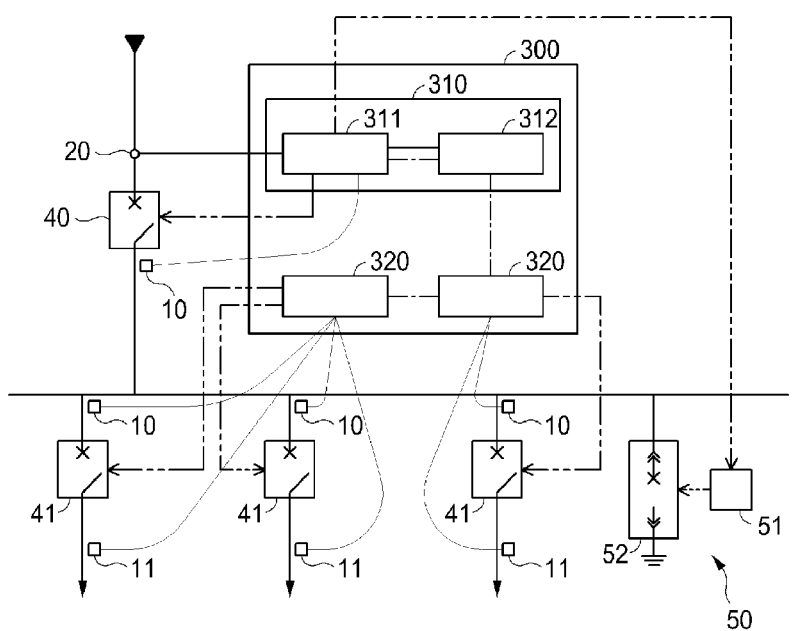
FIG. 2 is a schematic diagram illustrating an embodiment of a distribution panel included in the present invention.
Figure 3:
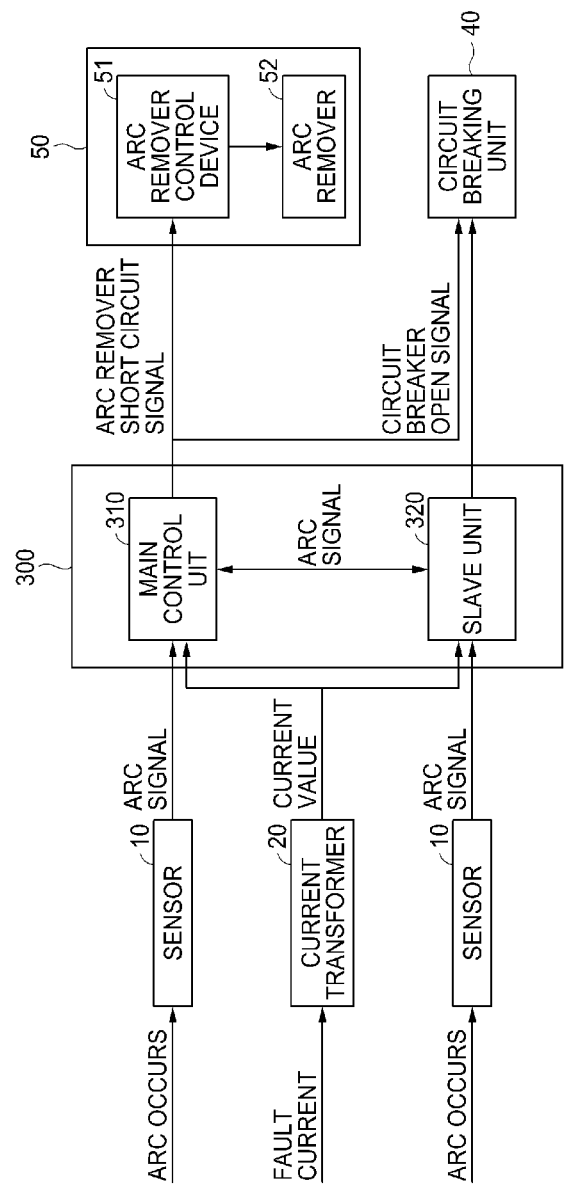
FIG. 3 is a block diagram of FIG. 2.
Figure 4:
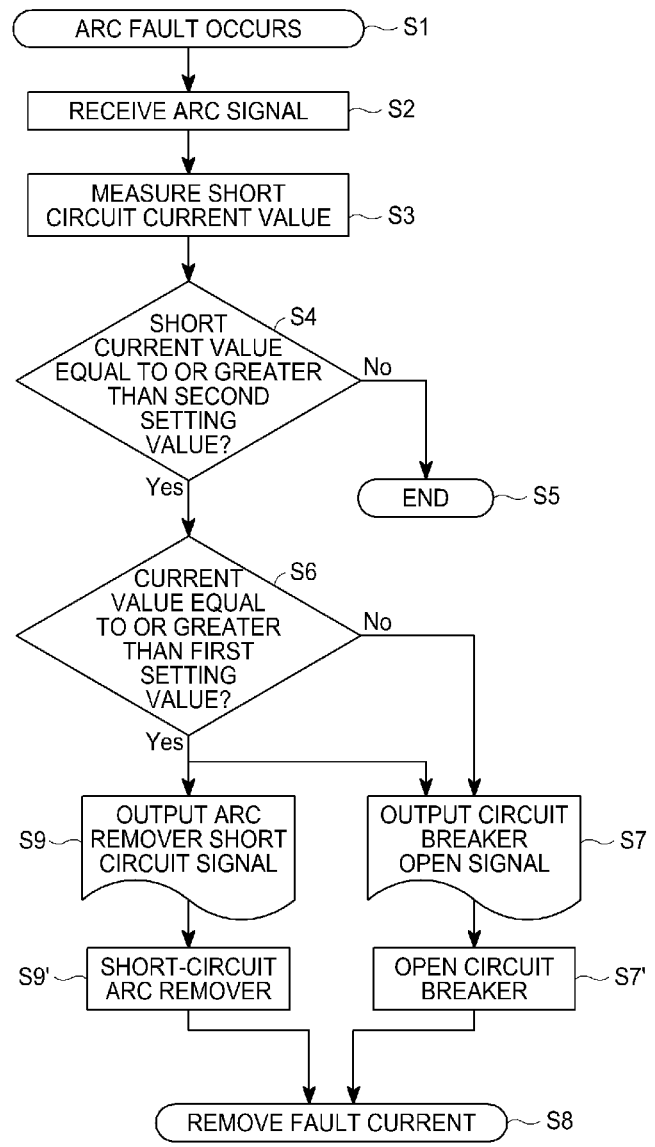
FIG. 4 is an operational flowchart of a control method for the arc protection system of FIG. 2.

FIG. 2 is a schematic diagram illustrating an embodiment of a distribution panel included in the present invention, FIG. 3 is a block diagram of FIG. 2, and FIG. 4 is an operational flowchart of a control method for the arc protection system of FIG. 2.

First, with reference to FIGS. 2 to 4, an arc protection system that separately protect a phase-to-phase short circuit fault or a ground/earth fault from a three-phase short circuit fault.

With reference to FIG. 2, the arc protection system of the present invention includes sensors 10 and 11 for sensing an arc fault 1 and an arc when the arc fault 1 occurs, a current transformer 20 for transforming a high current flowing through the distribution panel into a low current that is a certain ratio of the high current, an arc removing unit 50 for grounding a fault current of the distribution panel, circuit breaking units 40 and 41 installed to open or close a distribution panel circuit, and a control unit 300 for measuring a short circuit current value in the circuit when the sensor 10 senses the arc, and operating the arc removing unit 50 and the circuit breaking units 40 and 41.

The distribution panel includes a main circuit corresponding to a bus, which is a power supplying line, and a plurality of sub-circuits which are branched in parallel from the main circuit and to which power is distributed. In addition, the circuit breaking units include a main circuit breaker 40 installed in the main circuit and a sub-circuit breaker 41 installed in each of the plurality of sub-circuits. In addition, the sensor includes a first sensor 10 installed in a main circuit side to which the power is supplied and a second sensor 11 installed to a side to which the power is distributed. Accordingly, the current transformer 20, the main circuit breaker 40, and the first sensor 10 are installed in the main circuit, and the sub-circuit breaker 41, a first sensor 10 in the main circuit side and a second sensor 11 in the opposite side on the basis of the sub-circuit breaker 41 interposed therebetween are installed in the sub-circuit.

The sensors 10 and 11 are respectively installed in compartments of the distribution panel, and are designed to be resist to the strong pressure at the time of the arc fault. In addition, as the sensors 10 and 11, optical sensors such as point sensors are typically used, and temperature sensors that sense the temperature of scintillation upon the arc generation or loop sensors using the frequency of the scintillation may be used. Here, the point sensors and the loop sensors may be installed at connection parts of the cables and the busbar.

The current transformer 20 is an element for transforming the high current to a low current of a certain ratio, and is provided with an iron core, a primary coil and a secondary coil connected in series to the main circuit. The control unit 300 may measure a value of a short circuit current flowing through the main circuit by measuring a value of a current flowing through the secondary coil.

The arc removing unit 50 includes an arc remover 52 of which one end is connected to a power supply side and the other end is grounded, and which is installed to open or close between the power supply and the ground, and may further include an arc remover control device 51 for controlling an operation of the arc remover 52.

The arc remover 52 is installed in a space in which phase-to-phase insulation and ground/earth insulation may be maintained, and is installed to be connected to a rear end of the main circuit breaker 40 in order of system, and to maintain insulation with the ground unit. When a driving trip command is delivered to the arc remover 52, the arc remover 52 is inserted and a current flowing due to the arc fault is grounded and dissipated through the arc remover 52 that is three-phase-grounded with a lower impedance.

The arc remover control device 51 plays a role of receiving a trip command from the control unit 300 to drive the arc remover 52, and is installed close to the arc remover 52.

With reference to FIGS. 2 and 3, the control unit 300 is connected to the sensors 10 and 11, the current transformer 20, the arc removing unit 50, and the circuit breaking units 40 and 41, and operates the circuit breaking unit 40 and the arc removing unit 50 according to a short circuit current value measured through the current transformer 20, when the sensors 10 and 11 sense the arc.

When a setting value is set in consideration of a rated current value, the control unit 300 compares the setting value with the measured short circuit current value, and determines the current as a fault current when the short circuit current value is equal to or greater than the setting value. When the current is determined as the fault current, the arc removing unit 50 is short-circuited and the arc and the fault current are removed. And then the circuit breaking units 40 and 41 are open to cut off a current flowing to the distribution panel in which the fault has occurred and separate the corresponding system.

In detail, the control unit 300 is composed of a main control unit for operating the circuit breaking unit 40 and the arc removing unit 50 and including a first master unit 311 and a second master unit 312, and a slave unit 320 for expanding the function of the main control unit 310. Each component is communicably connected through an optical cable.

The first master unit 311 is electrically connected with the sensors 10 and 11 to receive an arc signal from the sensors 10 and 11. In addition, the first master unit 311 is also electrically connected with the current transformer 20 to measure the value of the short circuit current flowing through the main circuit. A fault point and whether the fault is a three-phase short circuit fault, or a phase-to-phase or ground/earth fault are determined by means of the arc signal from the sensors 10 and 11 and the short circuit current value. Thereafter, for the three-phase short circuit fault, the trip command is transmitted to operate the main circuit breaker 40 and the arc remover 52, which are connected through the optical cable. The three-phase short circuit fault may be determined by that a three-phase short circuit current is determined to flow when the short circuit current value is measured to be equal to or greater than a first setting value allocated to the first master unit 311. When the short circuit current value is smaller than the first setting value, it is not determined to be the three-phase short circuit fault, and in this case, the arc remover 52 does not operate. Here, the first setting value is a current value that corresponds to the three-phase short circuit current value, is slightly smaller than the current value at the time of the three-phase short circuit, and approximately corresponds to 5 to 8 times the rated current.

The second master unit 312 is communicably connected with the first master unit 311, and also electrically connected with the current transformer 20. It is also possible that the second master unit 312 penetrates through the first master unit 311 and then is connected with the current transformer 20. A second setting value is allocated to the second master unit 312, and the second master unit 312 determines whether the short circuit current value is equal to or greater than the second setting value, and shares the determined result with the first master unit 311. When the short circuit current value is equal to or greater than the second setting value, an arc fault (of three-phase short circuit, phase-to-phase short circuit, or ground/earth) is determined to occur. When the second mater unit 312 and the first master unit 311 shares that the short circuit current equal to or greater than the second setting value has been generated, the first master unit 311 emits the trip command for operating the circuit breaking unit 40. Here, the second setting value is a current value corresponding to a current generated by the phase-to-phase short circuit fault or the ground/earth fault, is slightly smaller than the current value at the time of the phase-to-phase short circuit fault or the ground/earth fault, and is approximately set within a range of one or two times of the rated current. In other words, the second setting value is set lower than the first setting value.

Unlike that only an arc protection relay corresponding to the first master unit 311 is used for determining a fault (a three-phase fault, a phase-to-phase fault, or a ground/earth fault), the second master unit 312 is further provided in addition to the first master unit 311 so that whether a fault occurs and a fault type are determined on the basis of the two setting values and then protection is performed by discerning the ground/earth fault or the phase-to-phase short circuit fault from the three-phase short circuit fault. This is for promoting economic feasibility by implementing such separate protection with typical components without developing or purchasing a new device. Accordingly, the first master unit 311 and the second master unit 312 are integrally formed, and may be surely controlled on the basis of the two setting values.

The slave unit 320 is electrically connected with a sensor, and may perceive fault occurrence and a fault point at the time of occurrence of an arc fault. Information about the fault occurrence and the fault point is shared with the main control unit 310 in real time, and the first master unit 311 operates the circuit breaking unit, and operates the arc removing unit 50 according to a short circuit current value measured at that time.

Meanwhile, the main circuit breaker 40 may operate through the master unit 311, and the sub-circuit breaker 41 may operate through the slave unit 320 installed adjacently thereto. The control unit 300 may simultaneously or selectively operate the main circuit breaker 40 and the sub-circuit breaker 41 according to an arc position perceived from the sensor, at the time of the phase-to-phase fault or the ground/earth fault. In other words, in the present invention, the main circuit breaker 40 operates, when the arc is sensed through the first sensor 10, and the sub-circuit breaker 41 operates, when the arc is sensed by the second sensor 11, and thus only a corresponding system in which the fault occurs is separated and the remaining power system may be used.

The control method according to an embodiment of the present invention will be described with reference to the flowchart of FIG. 4.

When the arc fault 1 occurs (step S1), the sensors 10 and 11 sense the arc fault 1 through the scintillation or the like, and deliver the arc signal to the control unit 300 (step S2). The first master unit 311 and the second master unit 312 measure a short circuit current value at the time of the fault through the current transformer 20 (step S3).

Thereafter, the second master unit 312 determines whether the short circuit current value is equal to or greater than the second setting value (step S4). When the current value is not equal to nor greater than the second setting value, it is determined that the arc fault 1 is not so large that the arc remover 52 or the circuit breaker is used, and thus the control unit 300 terminates the control (step S5).

On the other hand, when the short circuit current value is equal to nor greater than the second setting value, the arc fault 1 is determined to occur, and whether the short circuit current value is equal to or greater than the first setting value is determined (step S6). This is for determining whether the arc fault 1 is a three-phase short circuit fault, and the determination is performed by the first master unit 311.

When the current value is not equal to nor greater than the first setting value, the arc fault 1 is determined to be a phase-to-phase short circuit fault or a ground/earth fault, the first master unit 311 outputs a circuit breaker open signal (step S7), and the circuit breaker is opened (step S7'). Accordingly a current incoming to the distribution panel is cut off (step S8). In this case, the arc remover 52 does not operate. The arc becomes extinguished by the air or the like (step S8).

On the other hand, when the three-phase short circuit fault occurs and thus the current value is equal to or greater than the first setting value, the first master unit 311 outputs an arc remover short circuit signal (step S9), and outputs the circuit breaker open signal (step S7). Accordingly, both the circuit breaker and the arc remover 52 operate (steps S7' and S9'), the current of the distribution panel is cut off, and the fault current and the arc are removed by grounding (step S8).

Meanwhile, according to the position of the sensor for sensing the arc, the main circuit breaker 40 and the sub-circuit breaker 41 are simultaneously or selectively broken through the first master unit 311 and the slave unit 320 respectively, which possibly results in rapid and efficient art protection.

According, for the phase-to-phase short circuit fault or the ground/earth fault, the present invention does not operate the arc remover 52 that is highly dangerous, since the fault current is not large, the arc does not occur, and the arc energy is small, even when the arc occurs. Therefore, according to the present invention, an issue may be addressed in which a facility with low insulation strength is burnt out, when the arc remover 52 is operated even for the phase-to-phase short circuit fault or the ground/earth fault in which the fault current is not large, and grounding is performed in the three-phase short circuit state to cause a high current to flow in the entire distribution panel.

Figure 5:
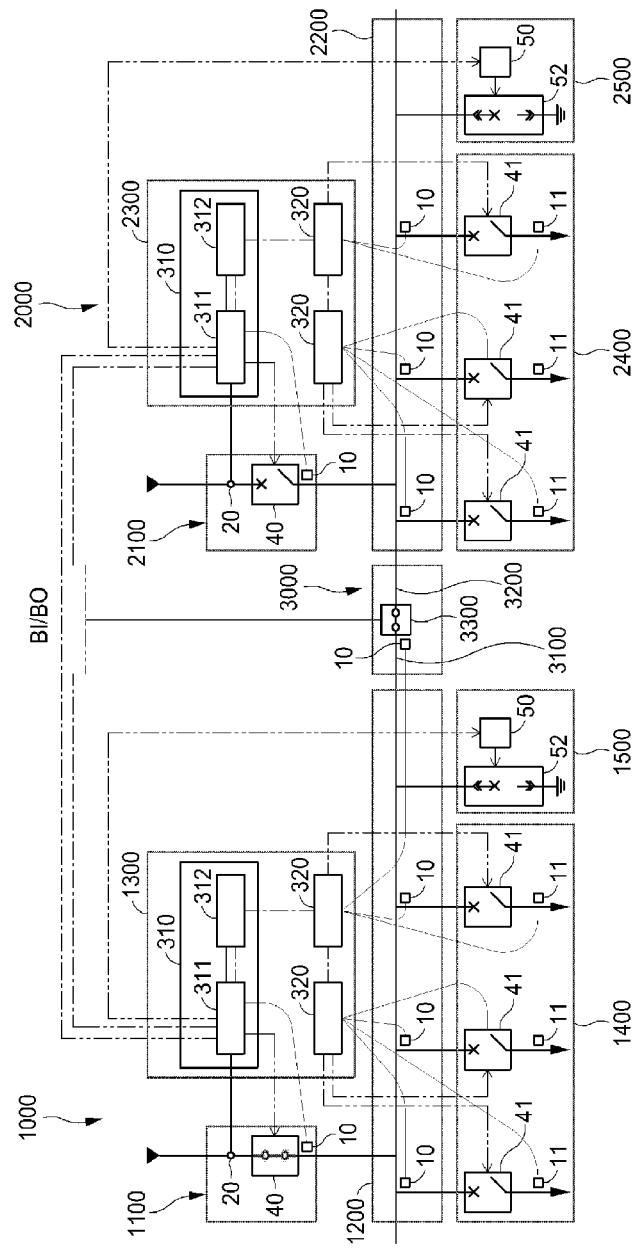
FIG. 5 is schematic diagram of an arc protection system that is an embodiment of the present invention.
Figure 6:
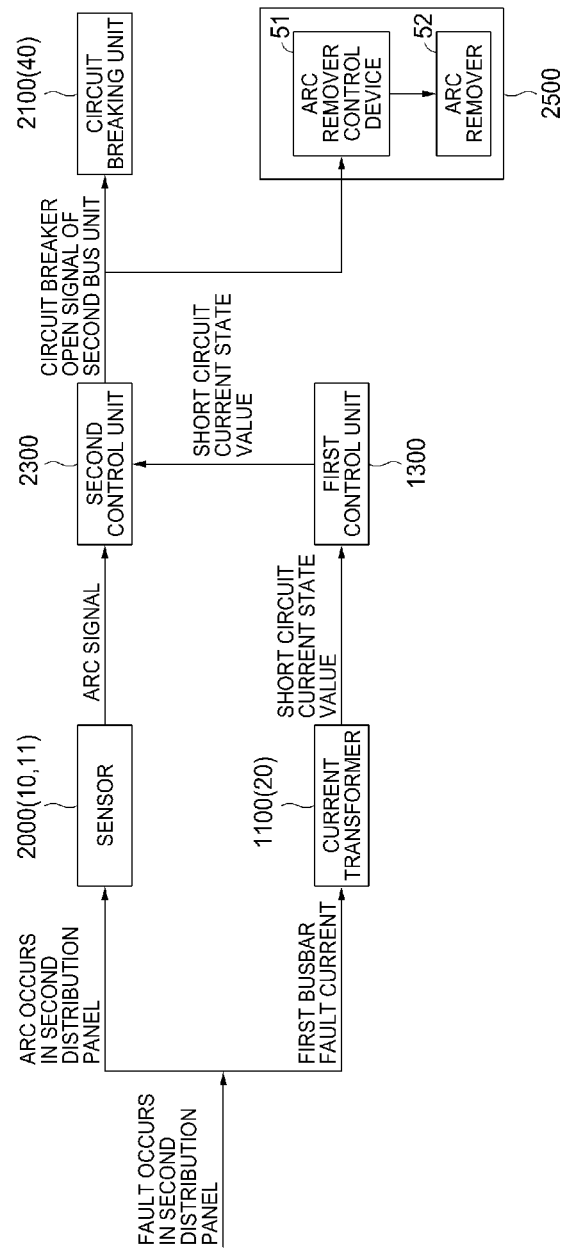
FIG. 6 is a block diagram of FIG. 5.
Figure 7:
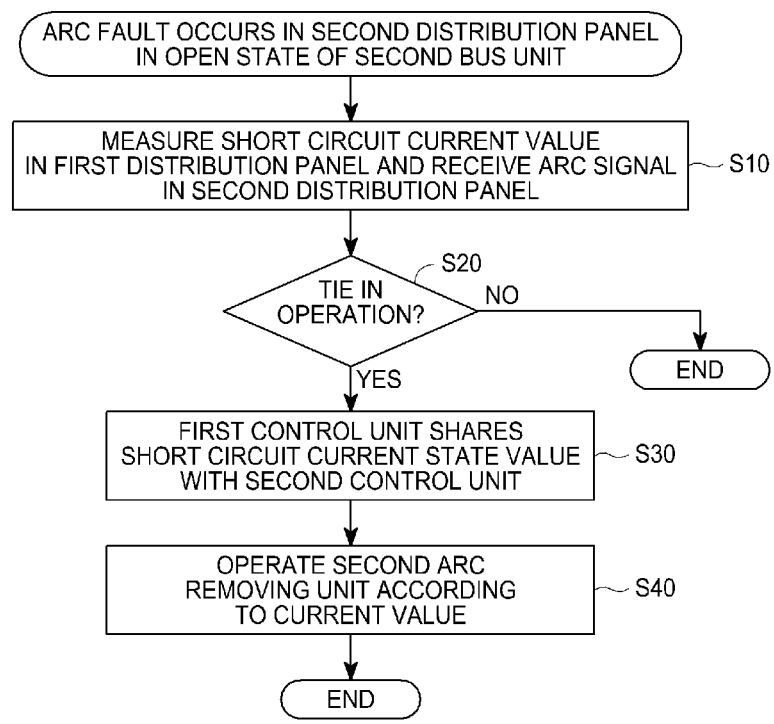
FIG. 7 is an operational flowchart of a control method for the arc protection system of FIG. 5.

FIG. 5 is a schematic diagram illustrating an embodiment of a distribution panel included in the present invention, FIG. 6 is a block diagram of FIG. 5, and FIG. 7 is an operational flowchart of a control method for the arc protection system of FIG. 5. The arc protection system for operating a plurality of distribution panels according to an embodiment of the present invention will be described with reference to FIGS. 5 to 7.

In an embodiment of the present invention, a first distribution panel 1000 and a second distribution panel 2000 including the aforementioned distribution panels are electrically connected by means of a tie 3000. The first distribution panel 1000 includes a first bus unit 1100 as an upper bus, which includes the current transformer 20 and the main circuit breaker 40, a first load unit 1400 connected to a load side cable and including a sub-circuit breaker 41 and the second sensor 11, a first busbar 1200 that connects the first bus unit 1100 and the first load unit 1400 and in which a plurality of the first sensors 10 are installed, and a first control unit 1300 for operating a first arc removing unit 1500 for grounding a short circuit current of a first busbar side, a circuit breaker in the first distribution panel 1000, and the first arc removing unit 1500. Like the first distribution panel 1000, the second distribution panel 2000 also includes a second bus unit 2100, a second load unit 2400, a second busbar 2200, a second arc removing unit 2500, and a second control unit 2300. The tie 3000 includes a primary cable 3100 connected with the first distribution panel 1000, a secondary cable 3200 connected with the second distribution panel 2000, and an interlock unit 3300 for electrically opening or closing the primary cable 3100 and the secondary cable 3200.

Furthermore, the first control unit 1300 and the second control unit 2300 are electrically or communicably connected so as to be able to share the fault current. Each of the first control unit 1300 and the second control unit 2300 includes a binary input and a binary output to be formed to deliver the short circuit current value of the first distribution panel 1000 to the second control unit 2300, or to deliver the short circuit current value of the second distribution panel 2000 to the first control unit 1300. Furthermore, an interlock circuit may be formed through an auxiliary contact point on a binary connection of the first control unit 1300 and the second control unit 2300 so that the short circuit current value may be delivered only when the interlock unit 3300 of the tie 3000 is connected and operated.

Accordingly, as the drawing, if the arc fault 1 occurs in the second distribution panel 2000 when the main circuit breaker 40 of the second bus unit 2100 is open in the second distribution panel 2000, and the first distribution panel 1000 and the tie 3000 are operating, the sensor in the second distribution panel 2000 may sense the arc fault 1, and the second control unit 2300 may receive a short circuit current state value of the first distribution panel 1000 from the first control unit 1300 to perceive occurrence of the short circuit current in the second distribution panel 2000.

Here, the short circuit current state value may mean a short circuit current value itself converted from an analog value into a binary value, or mean a short circuit generation state indicating whether the short circuit current is generated as 0 or 1. In other words, from the short circuit current state of the first distribution panel 1000, whether the short circuit current is generated in the second distribution panel 2000 may be known or the short circuit current value of the second distribution panel 2000 may be calculated.

Accordingly, when it is determined that the short circuit current is generated in the second distribution panel 2000 and thus the arc fault occurs, or the calculated short circuit current value of the second distribution panel 2000 corresponds to a ground/earth current, a phase-to-phase short circuit, or a three-phase short circuit current, the second arc removing unit 2500 is operated to ground the fault current of the second distribution panel 2000. Furthermore, as shown the FIGS. 2 to 4, when the three-phase short circuit fault is separated and protected and the calculated short circuit current value of the second distribution panel 2000 corresponds to the three-phase short circuit current, the second arc removing unit 2500 is operated to ground the fault current.

With reference to FIG. 6 again, when the arc fault 1 occurs in the second distribution panel 2000, the sensor senses that the arc occurs in the second distribution panel 2000 and delivers the arc signal to the second control unit 2300, the first control unit measures the fault current in the first busbar by means of the current transformer and delivers a short circuit current measurement state of the first distribution panel to the second control unit. Thereafter, the second control unit determines whether the short circuit current is generated or calculates the short circuit current value of the second distribution panel by means of the received short circuit current measurement state of the first distribution panel, and generates an open signal of the main circuit breaker 40 and an operation signal of the arc remover 52 of the second arc removing unit 2500 in the second bus unit 2100. However, in this case, the main circuit breaker 40 of the second bus unit 2100 is in an open state, and thus the open state is maintained.

In addition, with reference to FIG. 7 again, in the control method of the arc protection system according to an embodiment of the present invention, when an arc fault occurs in the second distribution panel during operation of the first distribution panel in a state in which the second bus unit is open, the short circuit current value is measured in the first distribution panel and an arc signal is received in the second distribution panel (step S10). Here, when the tie does not operate (step S30), the first distribution panel is considered to be separated from the second distribution panel, and thus the sensor is determined to be malfunctioned. On the other hand, when the tie operates (step S30), the short circuit current value of the first distribution panel, which is measured in the first control unit, is delivered to and shared with the second control unit (step S30). Thereafter, the second control unit may operate the second arc control unit according to the short circuit current value of the first distribution panel (step S40).

As a different example from FIGS. 6 and 7, even when the arc fault 1 occurs in the secondary cable 3200 of the tie 3000, the sensor in the first distribution panel 1000 may sense the arc fault 1, and operate the second arc removing unit 2500 by means of the short circuit current value measured in the second distribution panel 2000 and the sensing information about the arc fault 1, which is delivered from the first control unit 1300.

According to the aforementioned embodiments of the present invention, various effects as the following may be expected. However, the present invention is not achieved by exerting all of the following effects.

According to the present invention, for the phase-to-phase short circuit fault or the ground/earth fault, a damage to a facility, which occur by using an arc remover in all kinds of arc faults, and casualties, which occur when the facility is exploded, may be prevented by differently dealing with the phase-to-phase short circuit fault or the ground/earth fault from the three-phase short circuit fault.

Furthermore, for the phase-to-phase short circuit fault or the ground/earth fault, the present invention is effective in that the fault is rapidly restored, and is economical in that the facility is not burnt out.

In addition, when the plurality of distribution panels are operated, the control unit of each of the distribution panels is allowed to share the fault current or whether the fault current is sensed, and thus the weak points in protection may be improved, the weak points including that the fault current is not sensed in the upper bus side when the arc fault occurs, and that an arc protection system, which is required to be operated when the arc fault occurs in a tie part, does not operate.

In addition, the phase-to-phase short circuit fault or the ground/earth fault is dealt with differently from the three-phase short circuit fault, and thus a burnout issue of a facility with low insulation strength, which may occur when an arc remover is used to all kinds of the arc faults, and casualties that may occur when a distribution panel is exploded by an arc, may be prevented.

The above description is merely illustrative of the technical idea of the present invention, and those skilled in the art to which the present invention pertains various modifications and variations without departing from the essential characteristics of the present invention. The scope of protection should be interpreted by the following claims, and all technical ideas within the scope equivalent thereto should be construed as being included in the scope of the present invention.

What is claimed is:

1. An arc protection system comprising:
a sensor configured to sense an arc fault of a distribution panel;
an arc removing unit configured to ground a fault current;
a control unit connected to the sensor and configured to measure a short circuit current value of the distribution panel; and
a circuit breaking unit installed to open or close a circuit of the distribution panel,
wherein, when the arc fault is sensed and the short circuit current value corresponds to a three-phase short circuit current, the control unit is configured to drive the arc removing unit, and, when the short circuit current value is smaller than the three-phase short circuit current, the control unit is configured not to drive the arc removing unit,
wherein, when the short circuit current value is equal to or greater than a first setting value, the control unit is configured to determine that the three-phase short circuit current flows, and, when short circuit current value is equal to or greater than a second setting value that is smaller than the first setting value, the control unit is configured to open the circuit breaking unit, and
wherein the first setting value is set to be 5 to 8 times of a rated current, and the second setting value is set to be within a range of one or two times of the rated current.

2. The arc protection system of claim 1, wherein the distribution panel comprises: a main circuit; and a plurality of sub-circuits to which power is distributed from the main circuit,
the circuit breaking unit comprises: a main circuit breaker configured to open or close a current of the main circuit, and a sub-circuit breaker configured to open or close a current of the sub-circuits, and
the sensor comprises: a first sensor installed in the main circuit, and a second sensor installed in the sub-circuits,
wherein, when the arc fault is sensed by the first sensor, the main circuit breaker is configured to open, and, when the arc fault is sensed by the second sensor, the sub-circuit breaker is configured to open.

3. A control method of an arc protection system, the control method comprising:
sensing an arc fault when the arc fault occurs in a distribution panel, and measuring a short circuit current value of the distribution panel;
determining a range of the short circuit current value; and
grounding a fault current, when the short circuit current value corresponds to a three-phase short circuit current,
wherein the determining of the range comprises:
determining if the range of the short circuit value is equal to or greater than a first setting value, between the first setting value and a second setting value, or smaller than the second setting value, the second setting value being smaller than the first setting value;
determining a short circuit current as the three-phase short circuit current, when the short circuit current value is equal to or greater than the first setting value; and
opening a circuit breaking unit, when the current value is equal to or greater than the second setting value, to remove a current caused by the arc fault, and
wherein the first setting value is set to be 5 to 8 times of a rated current, and the second setting value is set to be within a range of one or two times of the rated current.

4. The control method of claim 3, wherein a circuit breaker of a main circuit or a circuit breaker of a sub-circuit to which power is distributed from the main circuit is selectively opened according to a position at which the arc fault is sensed.

5. An arc protection system of a distribution panel that supplies power from an upper bus to a plurality of lower buses, the arc protection system comprising:
a first distribution panel, a second distribution panel, and a tie configured to electrically connect the first distribution panel and the second distribution panel,
wherein each of the first distribution panel and the second distribution panel comprises:
a sensor configured to sense an arc fault of the distribution panel;
an arc removing unit configured to ground a fault current; and
a circuit breaking unit installed to open or close a circuit of the distribution panel,
wherein the first distribution panel comprises a first control unit connected to the sensor and configured to measure a short circuit current value of the first distribution panel,
the second distribution panel comprises a second control unit connected to the sensor and configured to measure a short circuit current value of the second distribution panel,
the first control unit and the second control unit share a short circuit current state value in a state in which the circuit breaking unit of the second distribution panel is open,
the short circuit current state value comprises a short circuit current value or whether a short circuit current is generated,
the second control unit uses the short circuit current state value of the first distribution panel when the sensor of the second distribution panel senses the arc fault, drives the arc removing unit when a three-phase short circuit current is determined to be generated in the second distribution panel, and does not drive the arc removing unit when the three-phase short circuit current is not determined to be generated.

6. The arc protection system of claim 5, wherein when the sensor in the second distribution panel senses the arc fault, the first control unit transmits the short circuit current state value of the first distribution panel to the second control unit, and the short circuit current state value comprises a short circuit current value or whether the short circuit current is generated.

7. The arc protection system of claim 6, wherein the second control unit determines whether the short circuit current is generated using the short circuit current value of the first distribution panel, which is transmitted from the first control unit, or calculates a short circuit current value of the second distribution panel, drives the arc removing unit when the short circuit current value of the second distribution panel is calculated and the calculated short circuit current value of the second distribution panel exceeds a setting value, the setting value is a lowest value of a current value at a time of three-phase short circuit of the second distribution panel, and the second control unit drives the arc control unit, when the calculated short circuit current value of the second distribution panel corresponds to the current at the time of the three-phase short circuit.

8. The arc protection system of claim 5, wherein the first unit and the second unit comprise a connection for a digital signal for transmitting and receiving bi-directionally the short circuit current value.

9. The arc protection system of claim 5, wherein the tie is formed to electrically connect or separate the first distribution panel and the second distribution panel, and is connected on the connection for the digital signal, and the first control unit transmits a short circuit current value measurement state of the first distribution panel to the second control unit in a state in which the tie is connected.

10. The control method of claim 5, wherein the first distribution panel and the second distribution panel are electrically connected with or separated from each other by a tie, and a short circuit current value measurement state of the first distribution panel is transmitted to the second distribution panel in a state in which the tie is connected.

* * * * *